United States Patent
Yamaguchi

(10) Patent No.: US 8,436,482 B2
(45) Date of Patent: May 7, 2013

(54) SEMICONDUCTOR DEVICE, AND METHOD OF FABRICATING SEMICONDUCTOR DEVICE

(75) Inventor: Tadashi Yamaguchi, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 170 days.

(21) Appl. No.: 12/792,036

(22) Filed: Jun. 2, 2010

(65) Prior Publication Data

US 2010/0327454 A1  Dec. 30, 2010

(30) Foreign Application Priority Data

Jun. 29, 2009  (JP) ................................ 2009-154054

(51) Int. Cl.
*H01L 23/544* (2006.01)
*H01L 23/48* (2006.01)

(52) U.S. Cl.
USPC ........... 257/797; 257/750; 257/758; 257/773; 438/401; 438/612

(58) Field of Classification Search .............. 438/14–18, 438/401, 612; 257/797, E23.06, 773, 750, 257/758; 174/250, 261–267
See application file for complete search history.

(56) References Cited

U.S. PATENT DOCUMENTS

| 7,358,608 | B2 | 4/2008 | Ohsumi | |
|---|---|---|---|---|
| 2001/0051441 | A1* | 12/2001 | Ziger et al. | 438/758 |
| 2003/0073257 | A1* | 4/2003 | Watanabe | 438/14 |
| 2004/0201097 | A1* | 10/2004 | Ohsumi | 257/737 |

FOREIGN PATENT DOCUMENTS

| JP | 2004-319638 | 11/2004 |
|---|---|---|
| JP | 2005026678 A | 1/2005 |

OTHER PUBLICATIONS

Japanese Office Action dated Nov. 13, 2012.

* cited by examiner

*Primary Examiner* — Asok K Sarkar
*Assistant Examiner* — Dmitriy Yemelyanov
(74) *Attorney, Agent, or Firm* — Volentine & Whitt, PLLC

(57) ABSTRACT

There is provided a semiconductor device including: an insulating layer provided on a substrate and formed with plural cavities; wiring lines provided on the insulating layer; plural branched wiring lines that branch from the wiring lines so as to respectively overlap with the plural cavities when seen in plan view; a conductive portion formed on the wiring lines; an external terminal formed on the conductive portion; and a sealing resin layer that seals the wiring lines and the conductive portion.

4 Claims, 13 Drawing Sheets

SEMICONDUCTOR DEVICE, AND METHOD OF FABRICATING SEMICONDUCTOR DEVICE

CROSS-REFERENCE TO RELATED APPLICATION

This application is based on and claims priority under 35 USC 119 from Japanese Patent Application No. 2009-154054 filed on Jun. 29, 2009, the disclosure of which is incorporated by reference herein.

BACKGROUND

1. Technical Field

The present invention relates to a semiconductor device, in particular to a small scale semiconductor device, typified by a Chip Scale Package (CSP), and to a method of fabricating a semiconductor device.

2. Related Art

Demands for reductions in size and reductions in thickness are increasing for integrated circuit packages in which semiconductor elements, such as semiconductor integrated circuits or the like, are packaged. Recently, focusing on semiconductor integrated circuit packages in fields where there are particular demands for reductions in thickness, Chip Scale Packages (CSP) have been proposed with spherical shaped terminals disposed in a lattice shape on the surface of semiconductor elements.

In Japanese Patent Application Laid-Open (JP-A) No. 2004-319638, a semiconductor device is described with an insulating layer disposed on a semiconductor substrate, a metal wiring layer disposed thereon, and post shaped electrodes formed to land portions of the metal wiring layer. In this semiconductor device, cavities of a cross shape are formed to the land portions, and the alignment precision of a mask for the post shaped electrode is raised by using these cavities as alignment marks.

Recently, higher precision is being demanded in the exposure alignment precision of each layer in semiconductor devices, in order to achieve even finer pitches and even finer patterning of semiconductor devices.

SUMMARY

An object of the present invention is to provide a semiconductor device capable of raising mask alignment precision, and a method of fabricating the semiconductor device.

A first aspect of the present invention provides a semiconductor device including:
an insulating layer provided on a substrate and formed with plural cavities;
wiring lines provided on the insulating layer;
plural branched wiring lines that branch from the wiring lines so as to respectively overlap with the plural cavities when seen in plan view;
a conductive portion formed on the wiring lines;
an external terminal formed on the conductive portion; and
a sealing resin layer that seals the wiring lines and the conductive portion.

According to the semiconductor device of the first aspect of the present invention, the mask alignment precision can be raised by performing mask positional alignment during fabrication by respectively overlapping plural branched wiring line portions, formed on the mask for forming the wiring lines and the branched wiring lines, with the plurality of cavities of the insulating layer.

A second aspect of the present invention provides the semiconductor device of the first aspect, wherein, for a mask for forming the wiring lines and the branched wiring lines, the cavities serve as alignment marks for performing positional alignment of the mask by overlapping the cavities with branched wiring line portions for forming the branched wiring lines.

According to the semiconductor device of the second aspect of the present invention, the mask alignment precision can be raised by performing mask positional alignment during fabrication, using the plural cavities of the insulating layer as alignment marks, and overlapping the plural cavities of the insulating layer with the plural branched wiring line portions of the mask.

A third aspect of the present invention provides the semiconductor device of the second aspect, wherein the plurality of cavities are configured by first graduation portions arrayed at equal intervals in a given direction, and second graduation portions arrayed at equal intervals in a direction orthogonal to the given direction.

According to the semiconductor device of the third aspect of the present invention, the mask alignment precision can be raised by arraying the cavities of the first graduation portion and the second graduation portion, serving as alignment marks, in mutually orthogonal directions.

A fourth aspect of the present invention provides a semiconductor device including:
an insulating layer provided on a substrate and formed with plural cavities;
wiring lines provided on the insulating layer;
plural cut-outs formed at the wiring lines, so as to respectively surround the plural cavities when seen in plan view;
a conductive portion formed on the wiring lines;
an external terminal formed on the conductive portion; and
a sealing resin layer that seals the wiring lines and the conductive portion.

According to the semiconductor device of the fourth aspect of the present invention, the mask alignment precision can be raised by performing mask positional alignment during fabrication by respectively surrounding the plural cavities of the insulating layer with plural cut-out portions formed to the mask for forming the wiring lines and cut-outs.

A fifth aspect of the present invention provides the semiconductor device of the fourth aspect, wherein, at marks for forming the wiring lines and the cut-outs, the cavities serve as alignment marks for performing positional alignment of the mark by being surrounded by cut-out portions for forming the cut-outs.

According to the semiconductor device of the fifth aspect of the present invention, the mask alignment precision can be raised by performing mask positional alignment during fabrication using the plural cavities of the insulating layer as alignment marks, by surrounding the plural cavities of the insulating layer with plural cut-out portions of the mask.

A sixth aspect of the present invention provides the semiconductor device of the fifth aspect, wherein the conductive portion is formed at the central side of a seat portion of the wiring line, and the cut-outs are formed at an external peripheral portion of the seat portion.

According to the semiconductor device of the sixth aspect of the present invention, the alignment precision of a mask for forming the conductive portion can be raised by performing mask positional alignment during fabrication using the cut-outs in the seat portion as alignment marks of the mask for forming the conductive portion.

A seventh aspect of the present invention provides a method of fabricating a semiconductor device including:

forming an insulating layer on a substrate and forming plural cavities in the insulating layer;

forming wiring lines on the insulating layer, using the plural cavities as alignment marks;

forming a conductive portion on the wiring line;

forming a sealing resin layer on the insulating layer so as to cover the side faces of the wiring lines and the conductive portion.

According to the method of fabricating a semiconductor device of the seventh aspect of the present invention, the alignment precision of a mask for forming wiring lines can be raised by using the plural cavities formed on the insulating layer as alignment marks for forming wiring lines on an insulating layer.

An eighth aspect of the present invention provides the method of the seventh aspect, wherein:

the plural cavities comprise a first graduation portion of cavities arrayed at equal intervals in a given direction, and a second graduation portion of cavities arrayed at equal intervals in a direction orthogonal to the given direction;

the wiring lines comprise first branched wiring lines arrayed at equal intervals in the given direction, and second branched wiring lines arrayed at equal intervals in the direction orthogonal to the given direction; and in a mask for forming the wiring lines, the first branched wiring lines and the second branched wiring lines, positional alignment is performed by overlapping, in plan view, the first graduation portion with first branched wiring line portions for forming the first branched wiring lines, and the second graduation portion with second branched wiring line portions for forming the second branched wiring lines.

According to the method of fabricating a semiconductor device of the eighth aspect of the present invention, the mask alignment precision can be raised by performing positional alignment of a mask by overlapping, in plan view, the first branched wiring line portion with the first graduation portion, and the second branched wiring line portion with the second graduation portion.

A ninth aspect of the present invention provides the method of the seventh aspect, wherein:

the conductive portion is formed to a seat portion of the wiring line:

plural cut-outs are formed at an external peripheral portion of the seat portion; and in a mask for forming the wiring lines and the plural cut-outs, positional alignment of the mask is performed by respectively surrounding, in plan view, the plural cavities with plural cut-out portions for forming the plural cut-outs.

According to the method of fabricating a semiconductor device of the ninth aspect of the present invention, the mask alignment precision can be raised by performing positional alignment of the mask by respectively surrounding, in plan view, the plural cavities with the plural cut-out portions.

A tenth aspect of the present invention provides the method of the ninth aspect, wherein when forming the conductive portion, the cut-outs are employed as alignment marks for positional alignment of the mask for forming the conductive portion.

According to the method of fabricating a semiconductor device of the tenth aspect of the present invention, the mask alignment precision of a mask for forming a conductive portion can be raised by utilizing the cut-outs as alignment marks in positional alignment of the mask for forming the conductive portion.

As explained above, the semiconductor device and semiconductor device method of fabricating the present invention can raise mask alignment precision.

BRIEF DESCRIPTION OF THE DRAWINGS

Exemplary embodiments of the present invention will be described in detail based on the following figures, wherein.

DETAILED DESCRIPTION

Semiconductor Device of a First Exemplary Embodiment

Explanation follows below of a first exemplary embodiment for implementing the present invention, with reference to the drawings.

Figure 1A:
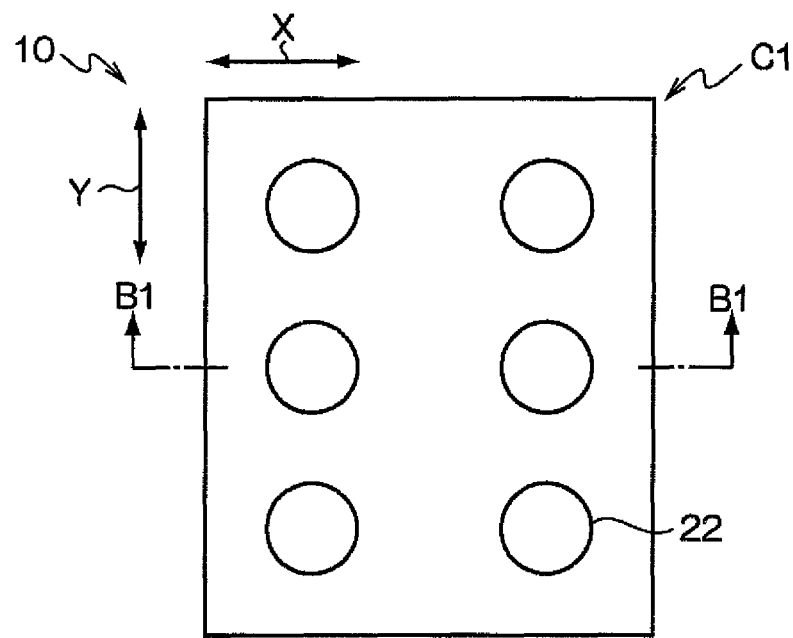
FIG. 1A is a plan view, as seen from the external terminal side, of a semiconductor device of a first exemplary embodiment of the present invention.
Figure 1B:
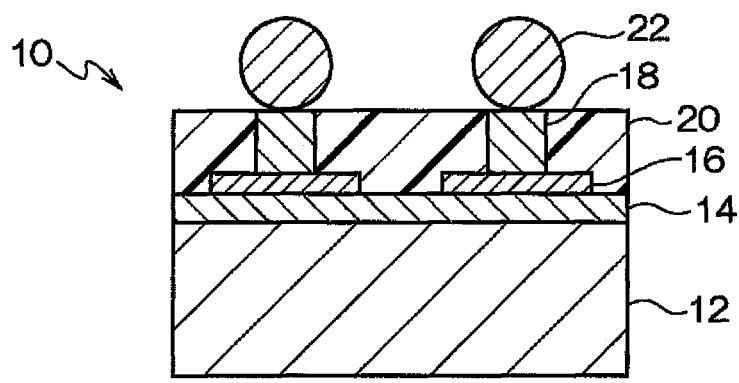
FIG. 1B is a cross-section taken on line B1-B1 in FIG. 1A.
Figure 1C:
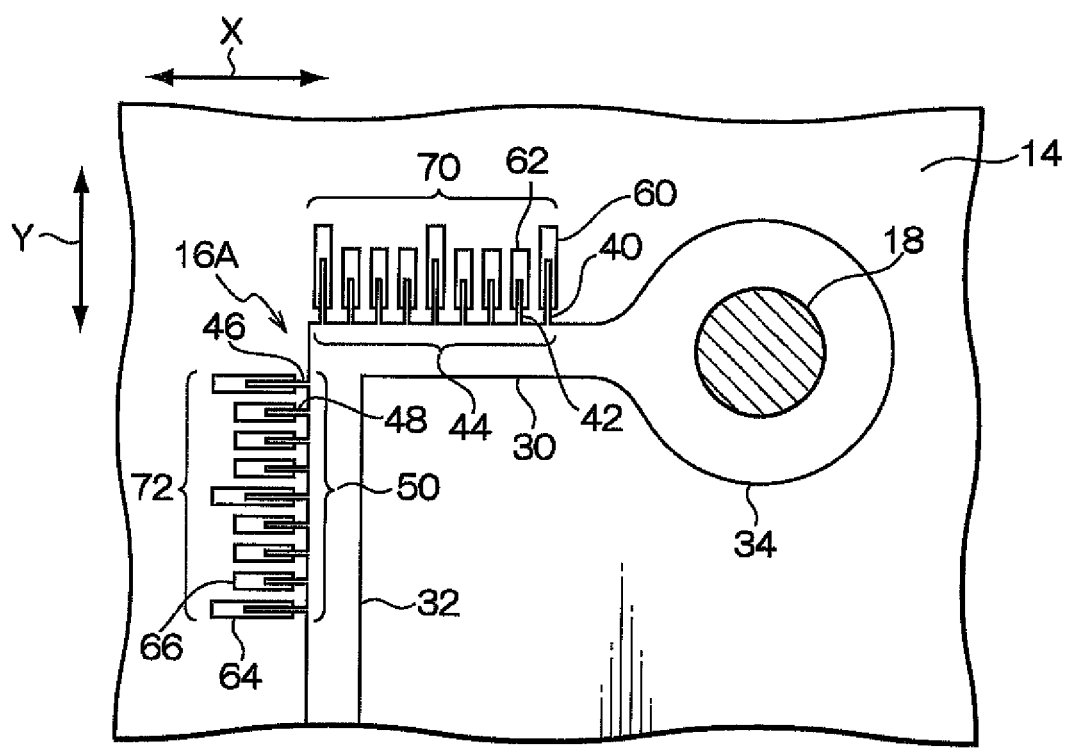
FIG. 1C is an enlarged cross-section of a portion of C1 in FIG. 1A.

FIG. 1A is a plan view of a semiconductor device 10 of the first exemplary embodiment of the present invention, as seen from the external terminal side, FIG. 1B is a cross-section taken on line B1-B1 in FIG. 1A, and FIG. 1C is an enlarged cross-section of a portion of C1 in FIG. 1A.

As shown in FIG. 1A, the semiconductor device 10 is of a substantially rectangular shape, with plural individual (six individual in the present exemplary embodiment) substantially spherical shaped external terminals 22 disposed on the surface of the semiconductor device 10.

Further, as shown in FIG. 1B, the semiconductor device 10 includes: an electronic circuit containing substrate 12; an insulating layer 14 formed on the substrate 12 by, for example, a polyimide or the like; plural redistribution lines 16 (an example of wiring lines) formed on the insulating layer 14; post shaped electrodes 18 (an example of conduction portions) formed on each of the respective redistribution lines 16; a sealing resin layer 20 formed on the insulating layer 14 and the redistribution lines 16, and covering and sealing the side faces of the post shaped electrodes 18; and the above external terminals 22 formed on the end faces of the post shaped electrodes 18 that are exposed from the surface of the sealing resin layer 20. Note that, in the present exemplary embodiment, while omitted in the drawings, there are through holes provide through the insulating layer 14, with a conductive layer formed in these through holes. This conductive layer is provided for each respective electronic circuit of the substrate 12, and is electrically connected to the electronic circuits. Each of the electronic circuits of the substrate 12 is electrically connected to the corresponding external terminal 22 through the conductive layer, the redistribution line 16 and the post shaped electrode 18.

FIG. 1C shows a redistribution line 16A that is one of the redistribution lines 16 respectively connecting each of the electronic circuits and each of the external terminals 22. The redistribution line 16A has a first wiring line portion 30 that extends in a given direction of the insulating layer 14 (the X axis direction in FIG. 1C), and a second wiring line portion 32 that extends from one end of the first wiring line portion 30 in a direction (the Y axis direction in FIG. 1C) orthogonal to the given direction of the insulating layer 14. Note that the other end of the first wiring line portion 30 serves as a seat portion 34, with one of the post shaped electrodes 18 formed in substantially a central portion of the seat portion 34.

Plural (three in the present exemplary embodiment) line shaped portions 40 are formed to the first wiring line portion 30, branching from the first wiring line portion 30 and extending out in the Y axis direction at equal intervals along the X axis direction. Further, plural (three in the present exemplary embodiment) line shaped portions 42 are formed to the first wiring line portion 30 between adjacent line shaped portions 40, the line shaped portions 42 branching from the first wiring line portion 30 so as to extend out in the Y axis direction and being shorter in length than the line shaped portions 40. Note that the uniform intervals are set between the line shaped portions 40 and the line shaped portions 42, and between the line shaped portions 42 themselves. These line shaped portions 40 and line shaped portions 42 form an X axis graduation, and the X axis graduation is referred to below as a line-side X axis graduation portion 44.

Plural (three in the present exemplary embodiment) line shaped portions 46 are formed to the second wiring line portion 32, branching from the second wiring line portion 32 and extending out in the X axis direction at equal intervals along the Y axis direction. Further, plural (three in the present exemplary embodiment) line shaped portions 48 are formed to the second wiring line portion 32 between adjacent line shaped portions 46, the line shaped portions 48 branching from the second wiring line portion 32, extending out in the X axis direction, and being shorter in length than the line shaped portions 46. Note that uniform intervals are set between the line shaped portions 46 and the line shaped portions 48, and between the line shaped portions 48 themselves. These line shaped portions 46 and line shaped portions 48 form an Y axis graduation, and the Y axis graduation is referred to below as a line-side Y axis graduation portion 50.

As shown in FIG. 1C, plural cavities are formed on the surface of the insulating layer 14, with the X axis graduation (referred to below as an insulating layer-side X axis graduation portion 70) formed by overlap of the line-side X axis graduation portion 44 with these plural cavities. Specifically, the line shaped portions 40 of the line-side X axis graduation portion 44 overlap with the grooves 60 of the insulating layer-side X axis graduation portion 70, and the line shaped portions 42 of the line-side X axis graduation portion 44 overlap with the grooves 62 of the insulating layer-side X axis graduation portion 70. The insulating layer-side X axis graduation portion 70 is configured from the grooves 60 (three in the present exemplary embodiment) and the grooves 62 that are shorter in length than the grooves 60, with plural individual (three in the present exemplary embodiment) of the grooves 62 formed between adjacent grooves 60. Note that uniform intervals are set between the grooves 60 and the grooves 62, and the intervals between the grooves 62 themselves.

Further, plural cavities are formed on the surface of the insulating layer 14, with the Y axis graduation (referred to below as an insulating layer-side Y axis graduation portion 72) formed by overlap of the line-side Y axis graduation portion 50 with these cavities. Specifically, the line shaped portions 46 of the line-side Y axis graduation portion 50 overlap with the grooves 64 of the insulating layer-side Y axis graduation portion 72, and the line shaped portions 48 of the line-side Y axis graduation portion 50 overlap with grooves 66 of the insulating layer-side Y axis graduation portion 72. The insulating layer-side Y axis graduation portion 72 is configured from the grooves 64 (three in the present exemplary embodiment) and the grooves 66 that are shorter in length than the grooves 64, with plural individual (three in the present exemplary embodiment) of the grooves 66 formed between adjacent grooves 64. Note that uniform intervals are set between the grooves 64 and the grooves 66, and the intervals between the grooves 66 themselves.

While in the present exemplary embodiment, as shown in FIG. 1C, the grooves have a wider width than the line shaped portions, the present invention is not limited to such a configuration, and the widths of the line shaped portions and the grooves may be the same as each other, or the width of the grooves may be narrower than the width of the line shaped portions.

Method of fabricating the Semiconductor Device of the First Exemplary Embodiment Explanation follows regarding the method of fabricating the semiconductor device 10.

Figure 2:
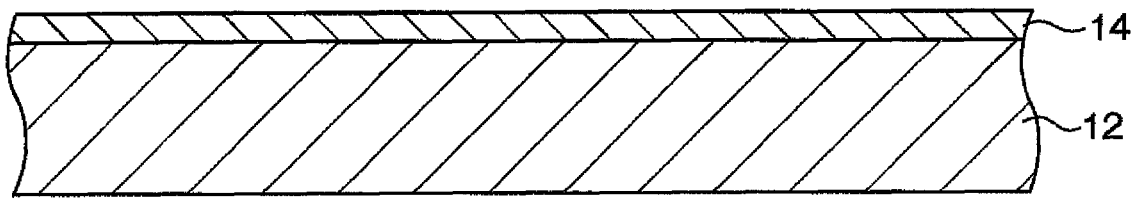
FIG. 2 is a transverse cross-section of a substrate, showing a state in which an insulating layer is formed on a substrate of the first exemplary embodiment.
Figure 3A:
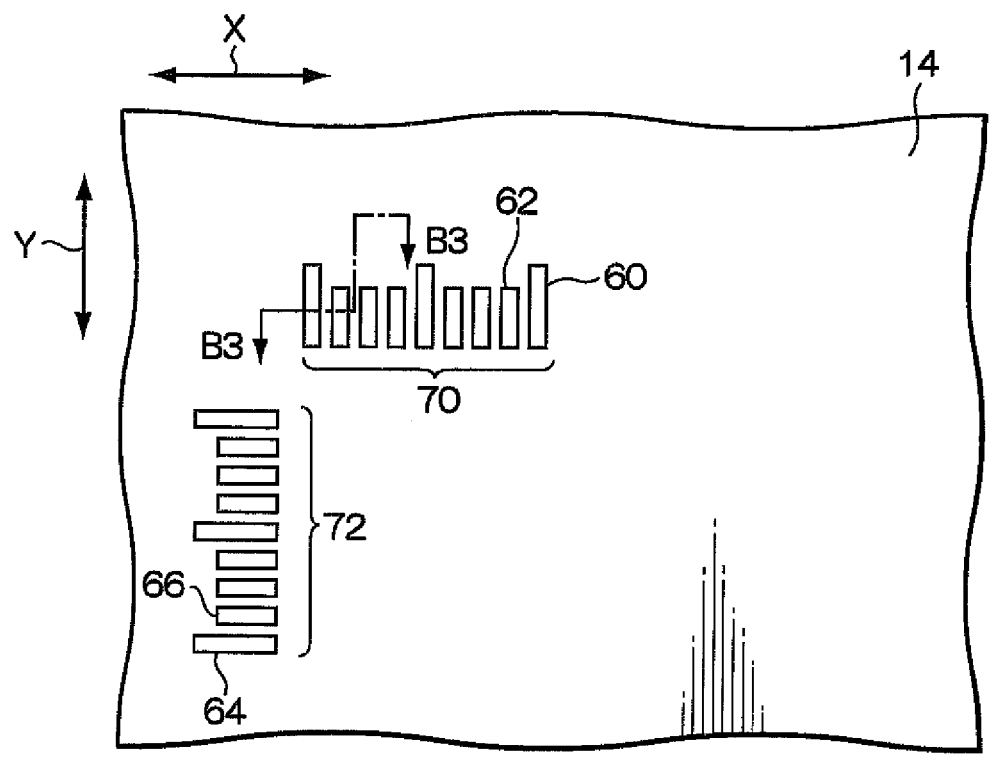
FIG. 3A is a plan view of an insulating layer showing a state in which cavities are formed in the surface of the insulating layer of the first exemplary embodiment.
Figure 3B:
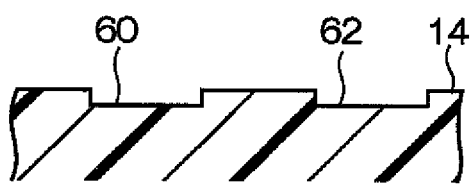
FIG. 3B is a cross-section taken on line B3-B3 of FIG. 3A.

First, as shown in FIG. 2, the insulating layer 14 of, for example, a polyimide or the like, is formed over the entire surface of the electronic circuit containing substrate 12, by, for example, spin coating or the like. Then, as shown in FIG. 3A and FIG. 3B, the insulating layer-side X axis graduation portion 70 and the insulating layer-side Y axis graduation portion 72 are formed on the surface of the insulating layer 14. When this is done, through holes, not shown in the figures, are formed in positions on the insulating layer 14 adjacent to each of the electronic circuits. Then, a conductive layer, not shown in the figures, is formed electrically connecting the insides of the through holes with the electronic circuits.

Figure 4:
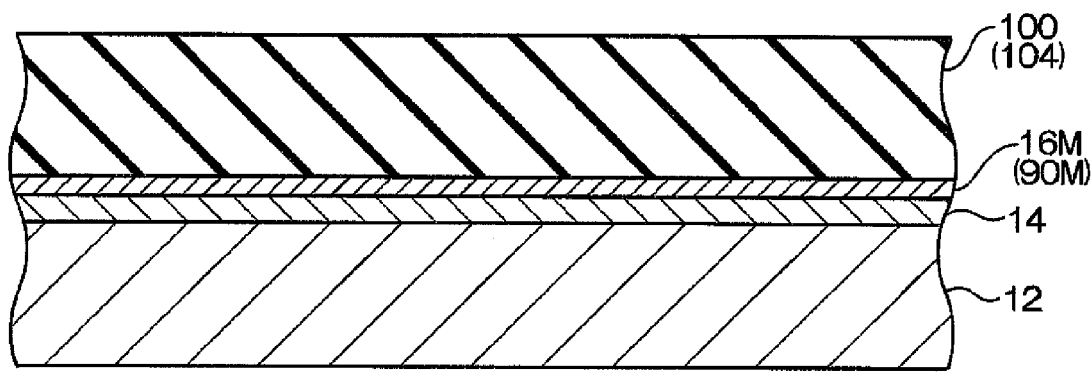
FIG. 4 is a transverse cross-section of a substrate, showing a state in which a metal film and a photoresist are formed on an insulating layer of the first exemplary embodiment.
Figure 5:
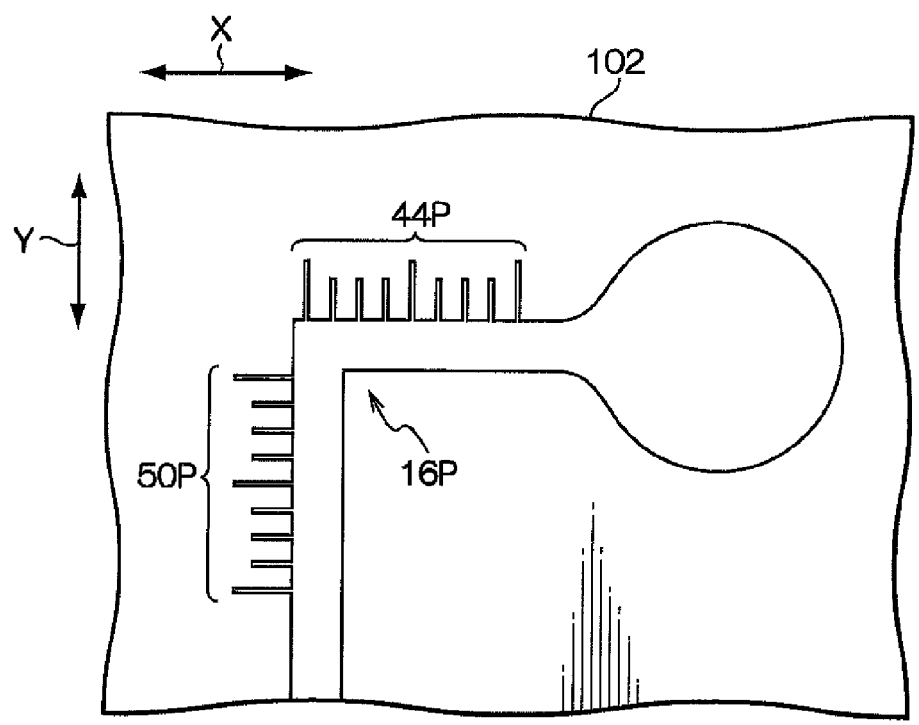
FIG. 5 is a plan view of a mask showing a portion of a wiring pattern of a mask for forming redistribution lines of the first exemplary embodiment.
Figure 6:
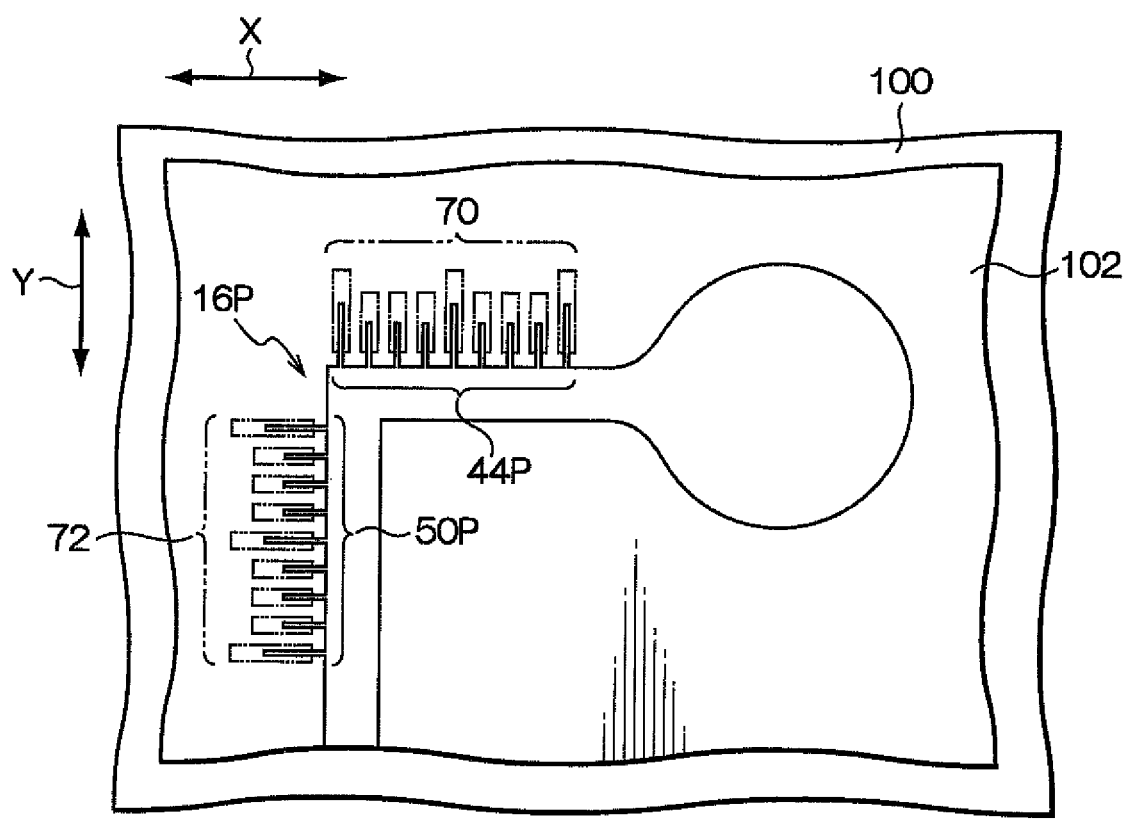
FIG. 6 is a plan view, as seen from the mask side, of a state in which a substrate of the first exemplary embodiment and a mask have been positionally aligned.

Next, as shown in FIG. 4, a metal film 16M is formed over the entire surface of the insulating layer 14 by, for example, a sputtering method or the like, and a photoresist 100 (light sensitive material) is formed over the entire surface of the metal film 16M. Then, based on positional data of the insulating layer-side X axis graduation portion 70 and the insulating layer-side Y axis graduation portion 72, detected in advance by a mark detector of an optical instrument, for example a stepper or the like, positional alignment is performed between the substrate 12 and a mask 102 that is formed with a wiring pattern 16P for forming redistribution lines 16 (including the redistribution line 16A), the line-side X axis graduation portion 44 and the line-side Y axis graduation portion 50. FIG. 5 and FIG. 6 show, in the wiring pattern 16P, an X axis graduation pattern 44P at the position for forming the line-side X axis graduation portion 44, and a Y axis graduation pattern 50P at the position for forming the line-side Y axis graduation portion 50. In this positional alignment, misalignment (X axis misalignment) between the insulating layer-side X axis graduation portion 70 and the X axis graduation pattern 44P is numericalized, misalignment (Y axis misalignment) between the insulating layer-side Y axis graduation portion 72 and the Y axis graduation pattern 50P is numericalized, and the position of the mask 102 is adjusted such that they overlap with each other in plan view (see FIG. 6). Therefore, the mask 102 is alignable in the desired position with high precision.

Figure 7:
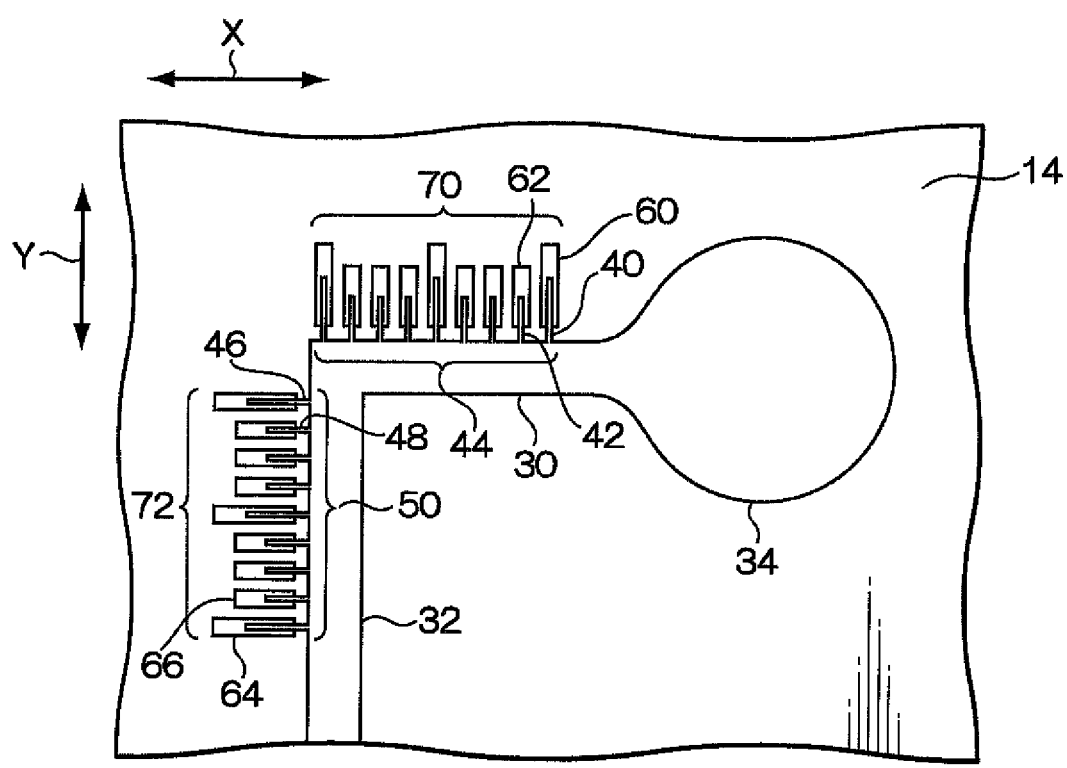
FIG. 7 is a plan view of redistribution lines, showing a state in which redistribution lines have been formed on an insulating layer of the first exemplary embodiment.

Next, the photoresist 100 is exposed based on the wiring pattern 16P on the mask 102, development processing is executed, and non-exposed portions of the resist are removed. Then, the metal film 16M is etched, and the remaining resist removed. The redistribution lines 16 are thereby formed on the insulating layer 14, as shown in FIG. 7.

Figure 8:
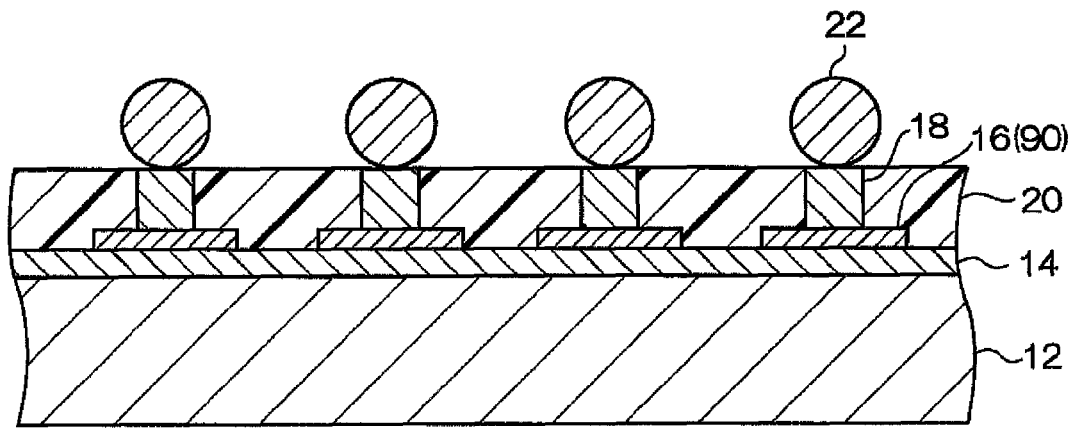
FIG. 8 is a transverse cross-section of a substrate, showing a state in which post shaped electrodes are formed on the redistribution lines of the first exemplary embodiment, a sealing resin layer is formed on the insulating layer and the redistribution lines, and external terminals are formed on the end faces of the post shaped electrodes.
Figure 9:
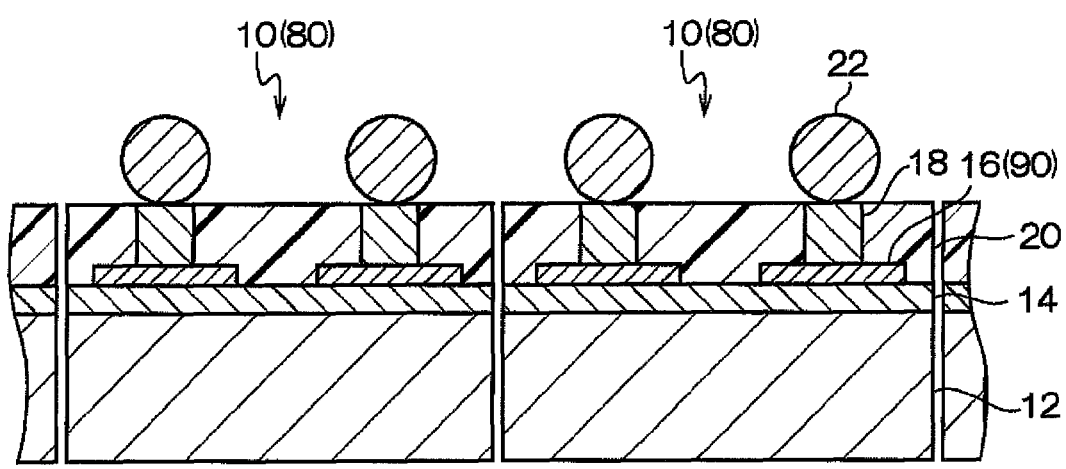
FIG. 9 is a transverse cross-section of a semiconductor device, showing a state in which a substrate of the first exemplary embodiment has been cut and plural semiconductor devices formed.

Next, as shown in FIG. 8, the post shaped electrodes 18 are formed to the redistribution lines 16 at central portions of the seat portion 34. Then, the sealing resin layer 20 is coated, so as to cover the insulating layer 14, the redistribution lines 16 and the post shaped electrodes 18. When this has been performed, the sealing resin layer 20 is ground by, for example, CMP or the like, so as to expose the end faces of the post shaped electrodes 18. Then, after performing processes, such as setting the external terminals 22 on the end faces of the post shaped electrodes 18, printing the back face of the substrate 12 (lot number, a mark indicating direction) and the like, the semiconductor elements are diced with a dicing saw, and the semiconductor device 10 divided into individual chips is thereby fabricated (see FIG. 9).

The redistribution lines 16 of the semiconductor device 10 here, to which the alignment processing of the mask 102 has been performed in the manner described above, are formed with high precision. Further, for example, in cases where a graduation is formed to a substrate from metal or the like, there would be a concern about this causing problems, such as difficulties when cutting into individual chips or the like, were the metal (from the graduation) to be disposed in the cutting locations (dicing area). In contrast thereto, in the present exemplary embodiment, the insulating layer-side X axis graduation portion 70 and the insulating layer-side Y axis graduation portion 72 are only formed in the redistribution line 16A of the redistribution lines 16, and are disposed at the center side and not formed in the dicing area of the semiconductor device 10, so problems do not arise when cutting.

Further, while the alignment marks for the mask 102, of the insulating layer-side X axis graduation portion 70 and the insulating layer-side Y axis graduation portion 72 respectively overlapping with the line-side X axis graduation portion 44 and the line-side Y axis graduation portion 50, branch from the redistribution line 16A, the present invention is not limited thereto, and a configuration not branching from the redistribution line 16A may be made. However, by branching from the redistribution line 16A, the line-side X axis graduation portion 44 and the line-side Y axis graduation portion 50 can be suppressed from peeling off from the insulating layer 14 during etching of the metal film 16M.

In the first exemplary embodiment, while the line-side X axis graduation portion 44 and the line-side Y axis graduation portion 50 are formed to the redistribution lines 16, the method of fabricating the semiconductor device of the present invention is not limited to such a configuration, and configuration may be made such that, after aligning the mask 102 and the substrate 12 and exposing the photoresist 100 based on the wiring pattern 16P on the mask 102, half-etching is performed only to the non-exposed portions on the photoresist 100 corresponding to the X axis graduation pattern 44P and the Y axis graduation pattern 50P, and other portions of the resist are removed. By configuring in such a manner, since configuration is made without the line-side X axis graduation portion 44 and the line-side Y axis graduation portion 50 being formed to the redistribution line 16A, the degrees of freedom for design of the wiring pattern are increased.

Semiconductor Device of Second Exemplary Embodiment

Explanation follows below of a semiconductor device 80 of a second exemplary embodiment for implementing the present invention, with reference to the drawings. Similar components to those of the first exemplary embodiment are allocated the same reference numerals and explanation is abbreviated.

The semiconductor device 80 is equipped with a first cavity 82, a second cavity 84, a first cut-out 94, and a second cut-out 96, in place of the insulating layer-side X axis graduation portion 70, the insulating layer-side Y axis graduation portion 72, the line-side X axis graduation portion 44, and the line-side Y axis graduation portion 50 of the semiconductor device 10 of the first exemplary embodiment. Specific explanation follows below.

Figure 10:
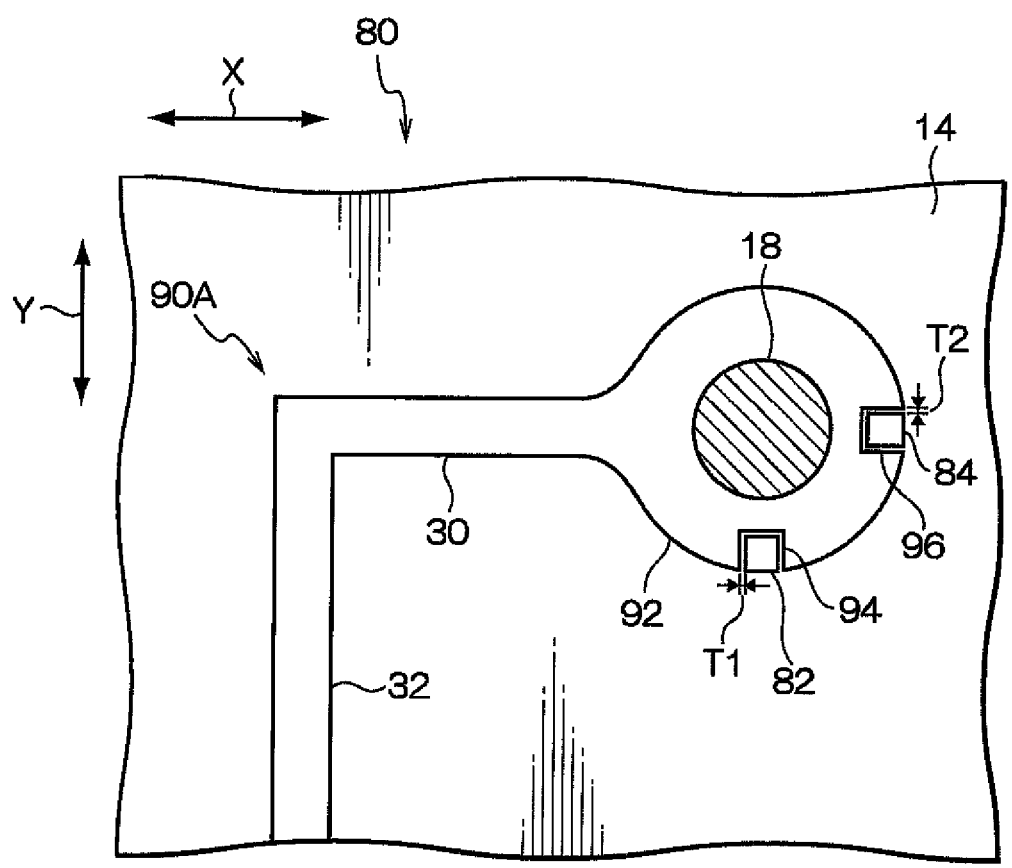
FIG. 10 is a plan view showing a portion of redistribution lines of a semiconductor device of a second exemplary embodiment.

FIG. 10 shows one redistribution line 90A from redistribution lines 90 that connect each of the respective electronic circuits with the external terminals 22. The redistribution line 90A is configured with two individual U-shaped cut-outs in an external peripheral portion of a seat portion 92, positioned at 90 degrees to each other about the center of the seat portion 92. One of the cut-outs will be referred to below as the first cut-out 94 and the other thereof as the second cut-out 96. Further, the post shaped electrode 18 is formed at a central portion of the seat portion 92. The post shaped electrode 18 is disposed so as not to overlap with the first cut-out 94 or the second cut-out 96 when seen in plan view.

Plural (two in the present exemplary embodiment) cavities are formed in the surface of the insulating layer 14. These plural cavities are configured by the substantially rectangular shaped first cavity 82 and second cavity 84. The first cavity 82 is surrounded by the first cut-out 94, and the second cavity 84 is surrounded by the second cut-out 96. Note that in the present exemplary embodiment, the width T1 of the gap portions between the first cavity 82 and the first cut-out 94 is substantially uniform, and the width T2 between the second cavity 84 and the second cut-out 96 is substantially uniform, with the width T1 and the width T2 substantially the same as each other.

Method of fabricating the Semiconductor Device of the Second Exemplary Embodiment Explanation follows regarding the method of fabricating the semiconductor device 80.

Explanation is abbreviated of similar processes to those of the method of fabricating the semiconductor device of the first exemplary embodiment.

Figure 11:
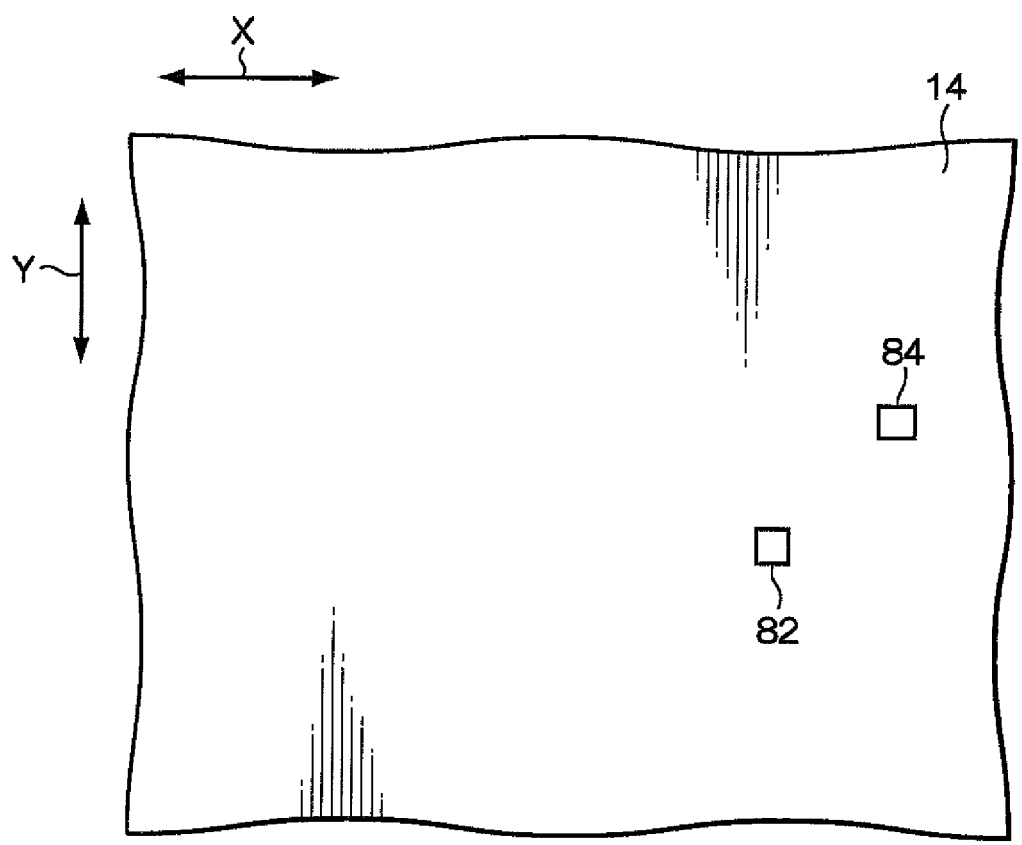
FIG. 11 is a plan view of an insulating layer, showing a state in which cavities are formed in the surface of an insulating layer of the second exemplary embodiment.

First, as shown in FIG. 2, the insulating layer 14 of, for example, a polyimide or the like, is formed over the entire surface of the electronic circuit containing substrate 12, by, for example, spin coating or the like. Then, as shown in FIG. 11, the first cavity 82 and the second cavity 84 are formed on the surface of the insulating layer 14. At this point in time, through holes, not shown in the figures, are formed in the insulating layer 14 at positions adjacent to each of the electronic circuits. Then, a conductive layer, not shown in the figures, is formed electrically connecting the insides of the through holes with the electronic circuits.

Figure 12:
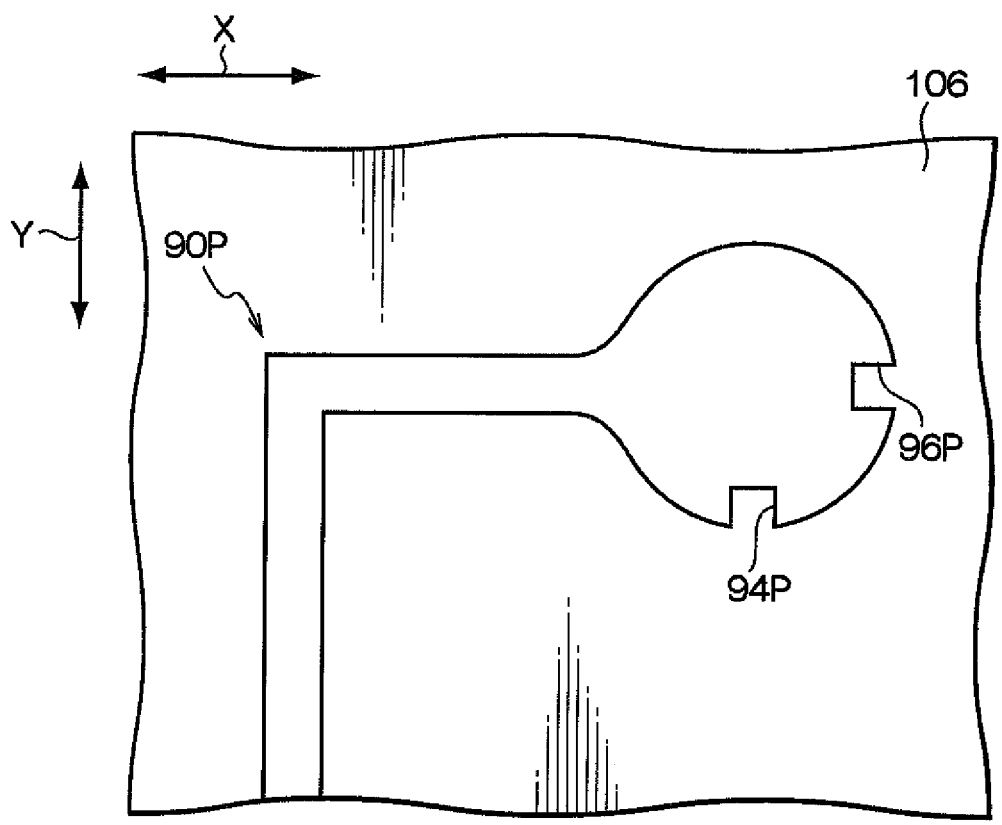
FIG. 12 is a plan view of a mask showing a portion of a wiring pattern of a mask for forming redistribution lines of the second exemplary embodiment.
Figure 13:
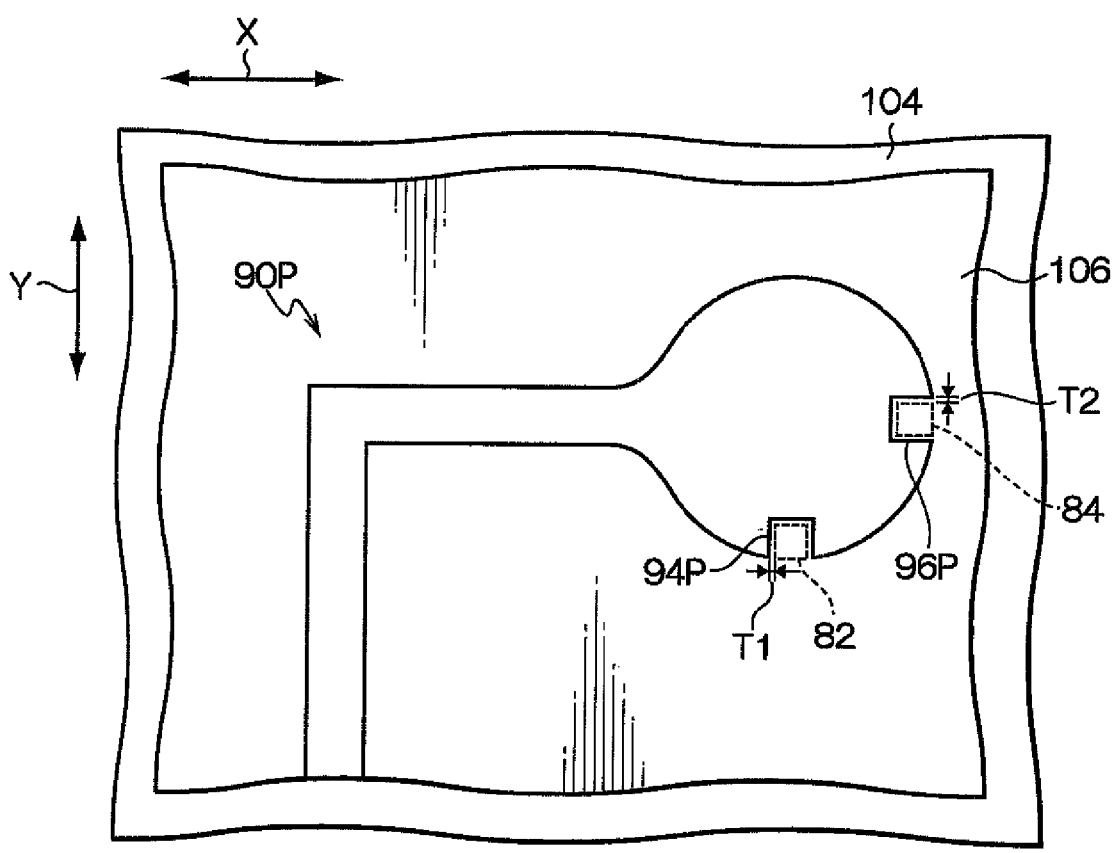
FIG. 13 is a plan view, as seen from the mask side, of a state in which the substrate of the second exemplary embodiment and a mask have been positionally aligned.

Next, as shown in FIG. 4, a metal film 16M (90M) is formed over the entire surface of the insulating layer 14 by, for example, a sputtering method or the like, and a photoresist 104 (light sensitive material) is formed over the entire surface of the metal film 90M. Then, based on positional data of the first cavity 82 and the second cavity 84, detected in advance by a mark detector of an optical instrument, for example a stepper or the like, positional alignment is performed between the substrate 12 and a mask 106 that is formed with a wiring pattern 90P for forming the redistribution lines 90 (including the redistribution line 90A), the first cut-out 94 and the second cut-out 96. In FIG. 12 and FIG. 13, in the wiring pattern 90P, the location for forming the first cut-out 94 is shown as a first cut-out pattern 94P, and the location for forming the second cut-out 96 is shown as a second cut-out pattern 96P. In this positional alignment, the position of the mask 106 is adjusted such that the first cavity 82 is surrounded by the first cut-out pattern 94P with a uniform width T1 of the gap portions between the first cut-out pattern 94P and the first cavity 82, and the second cavity 84 is surrounded by the second cut-out pattern 96P with a uniform width T2 of the gap portions to the second cut-out pattern 96P (see FIG. 13). Therefore, the mask 106 is alignable to the desired position with high precision.

Next, the photoresist 104 is exposed based on the wiring pattern 90P on the mask 106, developing processing is executed, and the non-exposed portions of the resist are removed. Then, the metal film 90M is etched, and the remaining resist is removed. Due thereto, as shown in FIG. 13, redistribution lines 90 are formed on the insulating layer 14.

Figure 14:
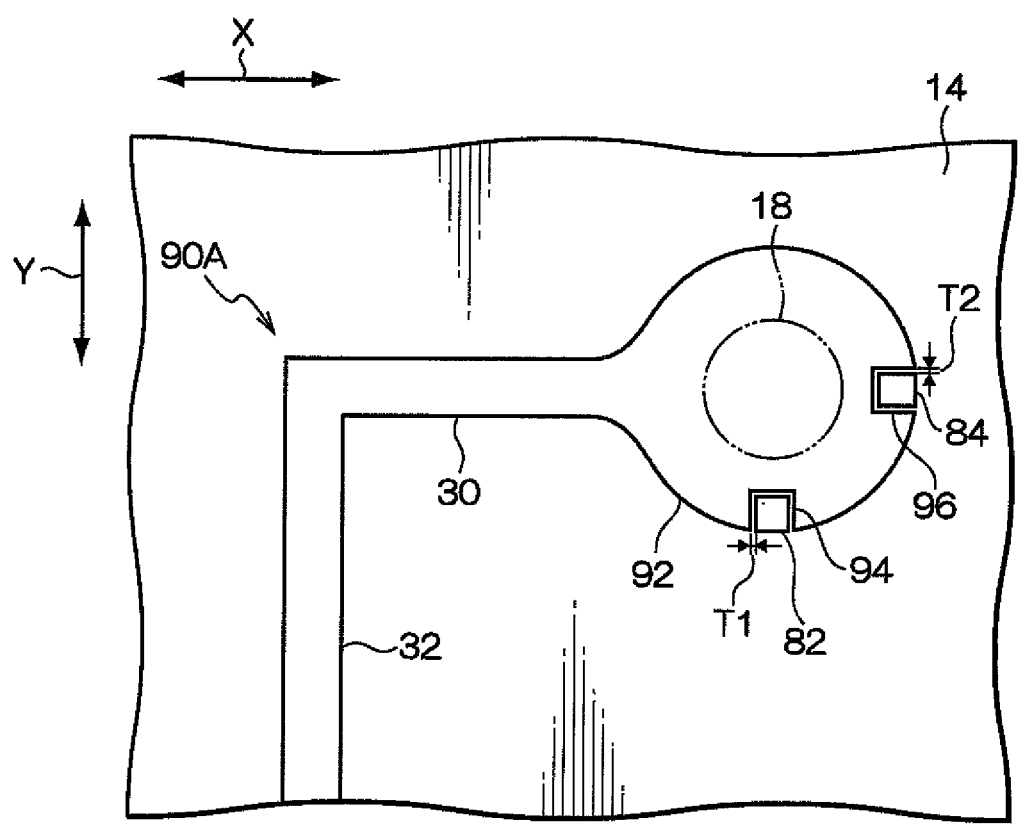
FIG. 14 is a plan view of redistribution lines, showing a state in which redistribution lines have been formed on the insulating layer of the second exemplary embodiment.

Next, as shown in FIG. 14, the post shaped electrode 18 is formed to the redistribution line 90 at a central portion of the seat portion 92. When forming the post shaped electrode 18, first, a photoresist, not shown in the figures, is formed over the entire surface of the redistribution lines 90 and the insulating layer 14, the positions detected of the first cut-out 94 and the second cut-out 96 detected in advance, positional alignment is performed of the substrate 12 with a mask formed with a pattern for forming the post shaped electrodes 18, based on the detected positional data, a resist pattern is formed to the photoresist by exposure and development, and the post shaped electrodes 18 are formed by electroplating processing at the exposed central portion of the seat portion 92.

Then, the sealing resin layer 20 is coated, so as to cover the insulating layer 14, the redistribution lines 90 and the post shaped electrodes 18. When this has been performed, the sealing resin layer 20 is ground by, for example, CMP or the like, so as to expose the end faces of the post shaped electrodes 18. Then, after performing processes, such as setting the external terminals 22 on the end faces of the post shaped electrodes 18, printing the back face of the substrate 12 (lot number, a mark indicating direction) and the like, the semiconductor elements are diced with a dicing saw, and the semiconductor device 80 divided into individual chips is thereby fabricated (see FIG. 9).

The redistribution lines 90 of the semiconductor device 80 to which the positional alignment of the mask 106 has been performed as described above, are formed with high precision, and the post shaped electrodes 18 formed to the seat portions 92 of the redistribution lines 90 are also disposed with high precision. Further, as shown in FIG. 10, since the first cut-out 94 and the second cut-out 96 are formed at an external peripheral portion of the seat portion 92, the degrees of freedom for design of the redistribution lines is raised compared to other positions thereof, and the resistance value can also be lowered. Further, by providing the seat portion 92 with the first cut-out 94 and the second cut-out 96 not overlapping with the post shaped electrode 18, any misalignment amount from the post shaped electrode 18 can be detected.

The present invention is not limited to the above exemplary embodiment, and configuration may be made with the line-side X axis graduation portion 44, and the line-side Y axis graduation portion 50, the first cavity 82, and the second cavity 84 formed on the surface of the insulating layer 14, and with the insulating layer-side X axis graduation portion 70, the insulating layer-side Y axis graduation portion 72, the first cut-out 94 and the second cut-out 96 formed to the redistribution lines.

Further, while in the first exemplary embodiment the first wiring line portion 30 and the second wiring line portion 32 were formed as line portions, the present invention is not limited thereto, and configuration may be made with line portions formed to the seat portion 34. Furthermore, while in the second exemplary embodiment configuration is made with cut-outs in the seat portion 34, the present invention is not limited thereto, and configuration may be made with cut-outs formed to the first wiring line portion 30 and the second wiring line portion 32.

Note that the fabrication methods of the semiconductor devices of the first exemplary embodiment and the second exemplary embodiment are merely examples thereof, and, for example, electroplating processing may be employed for forming the redistribution lines.

The present invention is explained above by way of exemplary embodiments, however, these are merely examples of embodiments, and various modifications may be made within a scope not departing from the spirit of the present invention. The scope of rights of the present invention is obviously not limited to these exemplary embodiments.

What is claimed is:

1. A semiconductor device comprising:
an insulating layer on a substrate and having a plurality of cavities;
wiring lines on the insulating layer;
a plurality of branched wiring lines that branch from the wiring lines so as to respectively overlap with the plurality of cavities;
a conductive portion on the wiring lines;
an external terminal on the conductive portion; and
a sealing resin layer that seals the wiring lines and the conductive portion,
wherein the wiring lines include a first wiring line portion that extends in a first direction, a second wiring line portion that extends from a first end of the first wiring line portion in a second direction orthogonal to the first direction, and a seat portion at a second end of the first wiring line portion,
wherein the plurality of cavities are configured by first graduation portions arrayed at equal intervals in the first direction, and second graduation portions arrayed at equal intervals in the second direction, and wherein the first graduation portions and the second graduation portions are formed at the first wiring line portion and the second wiring line portion, respectively.

2. The semiconductor device of claim 1, wherein, for a mask for forming the wiring lines and the branched wiring lines, the cavities serve as alignment marks for performing positional alignment of the mask by overlapping the cavities with branched wiring line portions for forming the branched wiring lines.

3. The semiconductor device of claim 1, further comprising;

a plurality of second cavities in the insulating layer; and a plurality of cut-outs at the wiring lines that respectively surround the plurality of second cavities.

4. The semiconductor device of claim 3, wherein the conductive portion is formed at a central side of the seat portion of the wiring line, and the cut-outs are formed at an external peripheral portion of the seat portion.

* * * * *